(12) United States Patent
Grinchuk et al.

(10) Patent No.: US 7,210,083 B2
(45) Date of Patent: Apr. 24, 2007

(54) SYSTEM AND METHOD FOR IMPLEMENTING POSTPONED QUASI-MASKING TEST OUTPUT COMPRESSION IN INTEGRATED CIRCUIT

(75) Inventors: Mikhail I. Grinchuk, San Jose, CA (US); Ahmad Alvamani, Santa Clara, CA (US); Erik Chmelar, San Jose, CA (US)

(73) Assignee: LSI Logic Corporation, Milpitas, CA (US)

( * ) Notice: Subject to any disclaimer, the term of this patent is extended or adjusted under 35 U.S.C. 154(b) by 232 days.

(21) Appl. No.: 11/013,641

(22) Filed: Dec. 16, 2004

(65) Prior Publication Data

US 2006/0156128 A1    Jul. 13, 2006

(51) Int. Cl.
*G01R 31/28* (2006.01)
(52) U.S. Cl. .................... 714/732; 714/729
(58) Field of Classification Search ............. 714/732, 714/729, 735, 724
See application file for complete search history.

(56) References Cited

U.S. PATENT DOCUMENTS

| | | | |
|---|---|---|---|
| 6,199,184 B1 * | 3/2001 | Sim | 714/732 |
| 6,240,537 B1 * | 5/2001 | Sim | 714/732 |
| 6,557,129 B1 | 4/2003 | Rajski et al. | 714/729 |
| 6,745,359 B2 | 6/2004 | Nadeau-Dostie | 714/726 |
| 6,829,740 B2 * | 12/2004 | Rajski et al. | 714/729 |
| 7,032,148 B2 * | 4/2006 | Wang et al. | 714/729 |
| 7,058,869 B2 * | 6/2006 | Abdel-Hafez et al. | 714/729 |
| 2003/0188269 A1 | 10/2003 | Mitra et al. | 716/2 |

OTHER PUBLICATIONS

*X-Compact, An Efficient Response Compaction Technique for Test Cost Reduction*, by Subhasish Mitra and Kee Sup Kim; Intel Corporation, Sacramento, CA, USA; ITC International Test Conference, Paper 11.2, 0-7803-7542-4/02 $17.00 © 2002 IEEE; pp. 311-320.

*X-Compact: An Efficient Response Compaction Technique*, by Subhasish Mitra and Kee Sup Kim; Intel Corporation, Sacramento, CA 95827, USA; IEEE Transactions on Cumputer-Aided Design of Integrated Circuits and Systems, vol. 23, No. 3, Mar. 2004; 0278-0070/04$20.00 © 2004 IEEE; pp. 421-432.

(Continued)

*Primary Examiner*—David Ton
(74) *Attorney, Agent, or Firm*—Suiter Swantz PC LLO

(57) ABSTRACT

The present invention provides a system and method for implementing postponed quasi-masking test output compression in an integrated circuit. The system includes a compressor for compressing a test response from N scan chains of an integrated circuit into M outputs. The test response may indicate faults in the integrated circuit. M and N are positive integers. The system further includes a correctable multiple input signature register with a size of M, which is communicatively coupled to the compressor. The correctable multiple input signature register is suitable for receiving the M outputs from the compressor as data inputs ($s[0], \ldots, s[M-1]$) and receiving M correction bits ($c[0], \ldots, c[M-1]$) and L address bits ($a[0], \ldots, a[L-1]$) as correction inputs, L being a positive integer, $2^L >= M$. The correctable multiple input signature register is suitable for detecting faults when there is no or at least one unknown value (i.e., X-value) in the test response.

21 Claims, 3 Drawing Sheets

OTHER PUBLICATIONS

*Convolutional Compaction of Test Responses*, by Janusz Rajski, Jerzy Tyszer, Chen Wang, Sudhakar M. Reddy; Mentor Graphics Corporation, 8005 S.W. Boeckman Road, Wilsonville, OR 97070, USA; ITC International Test Conference, Paper 29.3; 0-7809-8106-8/03 $17.00 © 2003 IEEE; pp. 745-754.

*Application of Saluja-Karpovsky Compactors to Test Responses with Many Unknowns*, by Janak H. Patel, Steven S. Lumetta, and Sudhakar M. Reddy; IEEE Computer Society, Proceedings of the 21st IEEE VLSI Test Symposium (VTS'03); 1093-0167/03 $17.00 © 2003 IEEE; 6 pages.

* cited by examiner

SYSTEM AND METHOD FOR IMPLEMENTING POSTPONED QUASI-MASKING TEST OUTPUT COMPRESSION IN INTEGRATED CIRCUIT

FIELD OF THE INVENTION

The present invention generally relates to the field of integrated circuits, particularly to a system and method for implementing postponed quasi-masking test output compression in an integrated circuit.

BACKGROUND OF THE INVENTION

As integrated circuits are produced with greater and greater levels of circuit density, efficient testing schemes that guarantee very high fault coverage while minimizing test costs and chip area overhead have become essential. However, as the complexity of circuits continues to increase, high fault coverage of several types of fault models becomes more difficult to achieve with traditional testing paradigms. This difficulty arises for several reasons. First, larger integrated circuits have a very high and still increasing logic-to-pin ratio that creates a test data transfer bottleneck at the chip pins. In addition, larger circuits require a prohibitively large volume of test data that must be then stored in external testing equipment. Moreover, applying the test data to a large circuit requires an increasingly long test application time. Furthermore, present external testing equipment is unable to test such larger circuits at their speed of operation.

Integrated circuits are presently tested using a number of structured design for testability (DFT) techniques. These techniques rest on the general concept of making all or some state variables (memory elements like flip-flops and latches) directly controllable and observable. If this can be arranged, a circuit can be treated, as far as testing of combinational faults is concerned, as a combinational or a nearly combinational network. The most-often used DFT methodology is based on scan chains. It assumes that during testing all (or almost all) memory elements are connected into one or more shift registers. A circuit that has been designed for test has two modes of operation: a normal mode and a test, or scan, mode. In the normal mode, the memory elements perform their regular functions. In the scan mode, the memory elements become scan cells that are connected to form a number of shift registers called scan chains. These scan chains are used to shift a set of test patterns into the circuit and to shift out circuit, or test, responses to the test patterns. The test responses are then compared to fault-free responses to determine if the circuit under test works properly.

Some of the DFT techniques include compactors to compress the test responses from the scan chains. FIG. 1 is a schematic diagram illustrating a prior art compactor being used to reduce a size of scan response. The maximum compaction may be achieved if the compactor is a finite-state machine (FSM), and the result of compaction is read once for a test vector or even after the whole set of test vectors. If the test response is completely deterministic, then there is a single correct final state of the FSM, and all other states correspond to faults. Increasing the number of FSM's states may rapidly reduce the probability of undetected faults and make it possible to distinguish among different faults.

The situation deteriorates if part of the test response bits are for some reason unknown (i.e., having unknown values or X-values). Each X-value may double the number of final legal states of the FSM. If the number of X-values reaches the number of flip-flops inside the FSM, then the final state may provide little information. To solve this problem, one of the following two approaches is usually used: X-tolerant compaction or pre-compaction (or pre-compression) masking.

Schemes with X-tolerant compaction may have the same configuration as shown in FIG. 1, except output values are observed more frequently (typically after each data shifting in scan chains). The compactor module is either a combinational circuit (e.g., in X-compact technique, see Subhasish Mitra and Kee Sup Kim, *X-compact: an efficient response compaction technique for test cost reduction*, ITC International Test Conference, 2002, paper 11.2, pp. 311–320; Subhasish Mitra and Kee Sup Kim, *X-compact: an efficient response compaction technique*, IEEE Trans. on CAD of IC and Systems, 2004, vol. 23, No. 3, pp. 421–432; and Subhasish Mitra and Kee Sup Kim, *Compacting circuit responses*, U.S. Patent Application Publication No. 2003/0188269, Oct. 2, 2003), or a finite-state machine (FSM) with finite impulse response (e.g., in the convolutional compaction technique, see Janusz Rajski, Jerzy Tyszer, Chen Wang and Sudhakar M. Reddy, *Convolutional compaction of test responses*, ITC International Test Conference, 2003, paper 29.3, pp. 745–754). One basic idea behind these two X-tolerant compaction approaches is as follows: if each scan out bit participates in multiple checksums, then X-value of another bit may probably destroy only part of these checksums, whereas the remaining checksums may continue to support observability of the scan out bit and detectability of corresponding faults of the design under test.

The pre-compaction masking approach works based on the following principle: if a particular scan out bit is known to be an X-value at a particular moment, then before compaction the X-value may be masked, e.g., via ANDing with external mask inputs (see FIG. 2 and Benoit Nadeau-Dostie, *Method of masking corrupt bits during signature analysis and circuit for use therewith*, U.S. Pat. No. 6,745,359, issued Jun. 1, 2004). After masking, all signals are fully deterministic, and a compactor may be used for compression. Since the total size of masks is huge (the same as the total size of all scan chains), the masks conventionally have to be compressed. However, such compression either requires complicated decoding and extra on-chip memory, or produces masking of "good" scan out bits (when, for example, the whole scan chain is masked out). Thus, to solve the foregoing-described problems, it is desirable to provide a new scheme to implement test output compression.

SUMMARY OF THE INVENTION

In an exemplary aspect, the present invention provides a system for implementing postponed quasi-masking test output compression in an integrated circuit. The system includes a compressor for compressing a test response from N scan chains of an integrated circuit into M outputs, where M and N are positive integers. The test response may indicate faults in the integrated circuit. The system further includes a correctable multiple input signature register with a size of M, which is communicatively coupled to the compressor. The correctable multiple input signature register is suitable for receiving the M outputs from the compressor as data inputs ($s[0], \ldots, s[M-1]$) and receiving M correction bits ($c[0], \ldots, c[M-1]$) and L address bits ($a[0], \ldots, a[L-1]$) as correction inputs, L being a positive integer, $2^L >= M$. The correctable multiple input signature register is suitable for detecting faults when there is no or at least one unknown value (i.e., X-value) in the test response.

In an additional exemplary aspect, the present invention provides a system for implementing postponed quasi-masking test output compression in an integrated circuit. The system includes a compressor for compressing a test response from N scan chains of an integrated circuit into M outputs, where M and N are positive integers. The test response may indicate faults in the integrated circuit. The system further includes a means for detecting faults when there is no or at least one unknown value (i.e., X-value) in the test response. The means for detecting is communicatively coupled to the compressor for receiving the M outputs from the compressor as data inputs.

In another exemplary aspect, the present invention provides a method for implementing postponed quasi-masking test output compression in an integrated circuit. The method may include steps as follows. Locations of at least one X-value, both in terms of time (i.e., clock cycles at which the X-value will reach a multiple input signature register) and space (i.e., positions in the N inputs to a compactor), are provided in a test response from N scan chains of an integrated circuit, N being a positive integer. A single state is obtained by resetting (i.e., initializing) filp-flops of the multiple input signature register at T=0 (i.e., at the very beginning). For every correction clock cycle (T, 2T, 3T, . . . ), sets of possible states of a multiple input signature register, detection bits and correction vectors are sequentially identified.

It is to be understood that both the foregoing general description and the following detailed description are exemplary and explanatory only and are not restrictive of the invention as claimed. The accompanying drawings, which are incorporated in and constitute a part of the specification, illustrate an embodiment of the invention and together with the general description, serve to explain the principles of the invention.

BRIEF DESCRIPTION OF THE DRAWINGS

The numerous advantages of the present invention may be better understood by those skilled in the art by reference to the accompanying figures in which.

DETAILED DESCRIPTION OF THE INVENTION

Reference will now be made in detail to the presently preferred embodiments of the invention, examples of which are illustrated in the accompanying drawings.

The present invention provides a novel masking scheme to implement test output compression, in which masking is performed after compression. The present invention may avoid problems associated with conventional pre-compression masking such as complicated decoding, extra on-chip memory, masking of "good" scan out bits, or the like.

Figure 1:
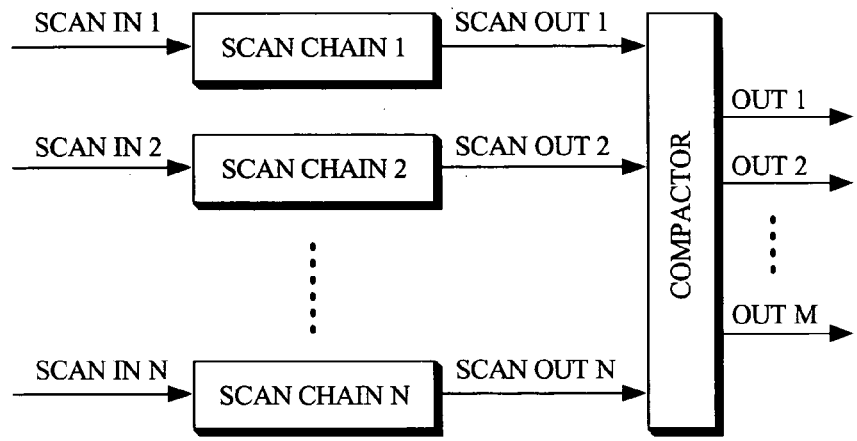
FIG. 1 is a schematic diagram illustrating a prior art compactor being used to reduce a size of scan response.
Figure 2:
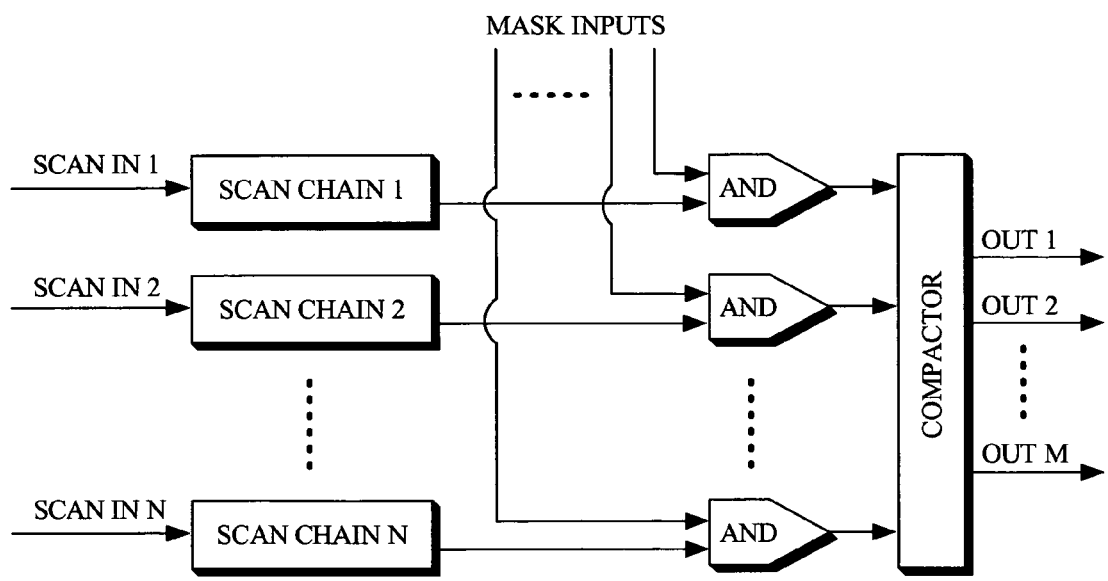
FIG. 2 is a schematic diagram illustrating prior art pre-compaction response masking.
Figure 3:
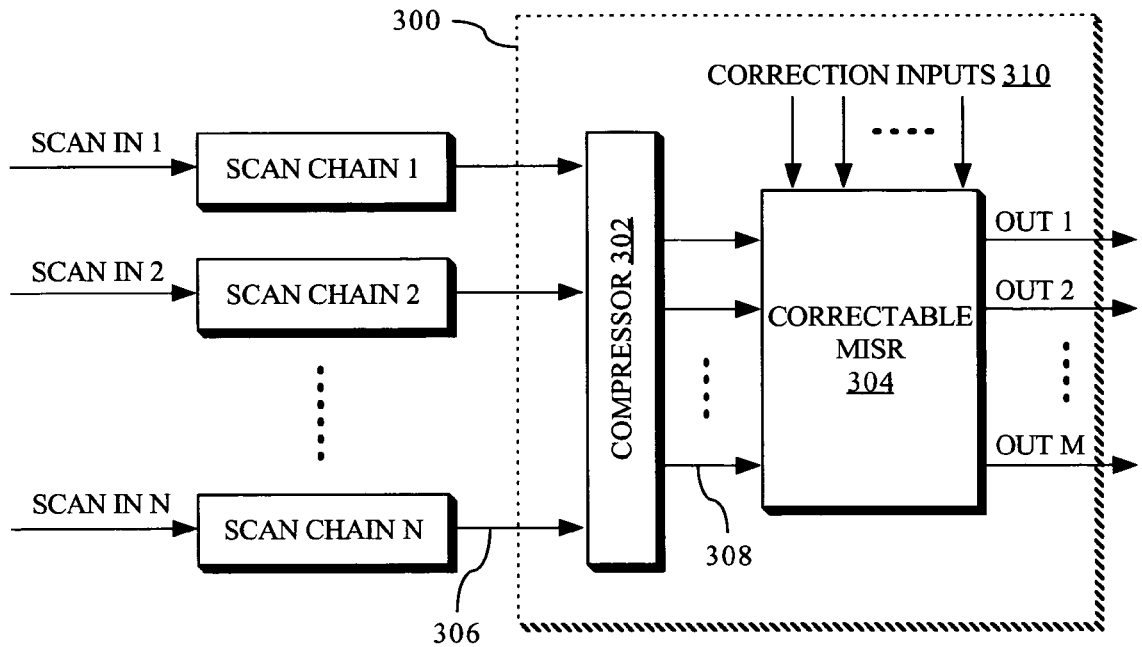
FIG. 3 is a schematic diagram illustrating a system for implementing postponed quasi-masking test output compression in an integrated circuit in accordance with an exemplary embodiment of the present invention.

Referring now to FIG. 3, a schematic diagram illustrating a system 300 for implementing postponed quasi-masking test output compression in an integrated circuit in accordance with an exemplary embodiment of the present invention. As shown, the system 300 may receive a test response (i.e., scan output vectors) 306 from N scan chains of an integrated circuit. Suppose in case of no X-values in the test response 306, a multiple input signature register (MISR) of size S (i.e., a linear FSM with S flip-flops, where input of each flip-flop is XOR of some data inputs and some outputs of other flip-flops) may be used to detect and distinguish faults with "good enough" quality in the test response 306. Then, suppose there is no more than one X-value per T clock cycles in average in the test response 306 (more precisely—no more than (A+t/T) X-values for any sequence of t clock cycles for any t, the parameter "A" representing the number of ambiguities since each X-value is not compensated immediately and thus there are not-yet-corrected ambiguities). Thus, one may select M>(S+A) as a size for a correctable multiple input signature register (MISR) 310.

As shown, the system 300 includes a compressor 302 for compressing the test response 306 from N scan chains of an integrated circuit into M outputs 308. The test response 306 may indicate faults in the integrated circuit. M and N are positive integers. The compressor 302 may be a combinational circuit with N inputs and M outputs, which computes a linear mapping (i.e., each output is XOR of some of inputs). The actual structure of the compressor 302 may be almost random. However, the functional requirement for the compressor 302 is the following: if x=(x1, . . . , xN) and y=(y1, . . . , yN) are two different input vectors producing the same output values, then the number of positions where xi differs from yi has to be as large as possible. Preferably, output values of the compressor 302 must be different if the input vectors x=(x1, . . . , xN) and y=(y1, . . . , yN) differ in a single bit.

The system 304 further includes the correctable MISR 304 with a size of M, which is communicatively coupled to the compressor 302. The correctable MISR 304 is suitable for receiving the M outputs 308 from the compressor 302 as data inputs (s[0], . . . , s[M−1]) and receiving M correction bits (c[0], . . . , c[M−1]) and L address bits (a[0], . . . , a[L−1]) as correction inputs 310, L being a positive integer, $2^L>=M$. The correctable MISR 304 is suitable for detecting faults when there is no or at least one unknown value (i.e., X-value) in the test response 306. Preferably, the correctable MISR 304 is a FSM with M data inputs and M+L correction inputs, where $2^L>=M$.

It is understood that the correctable MISR 304 is not actually masking the X-value(s), but performs a more complicated transformation which replaces the pair "masking+ compacting" (thus "quasi-masking"). Briefly, if an N-bit test response has X-value(s), then there are multiple N-bit vectors representing correct behavior of the chip under test. These N-bit vectors are compressed into shorter M-bit ones (and, due to some properties of "good" compression, even a single original X-value typically results in the M-bit vectors with multiple mismatches). The following is an example. Suppose an N-bit (N=8) test response is 010001X0, i.e., 01000100 or 01000110. Suppose the compression converts 8 bits into 6 bits using the following rules ("^" means "XOR": 0^0=1^1=0,0^1=1^0=1):

Y1 =X1^X2^X3^X4

Y2 =X5^X6^X7^X8

Y3 =X1^X2^X5^X6

Y4 =X3^X4^X7^X8
Y5 =X1^X3^X5^X7
Y6 =X2^X4^X6^X8

That is,
   01000100→110000
   01000110→100110

It is not possible to eliminate this ambiguity by masking a single bit. Instead, one may use 1 bit to detect variants (in the current example, it may be Y2, Y4, or Y5—say, Y4 was chosen), and, if its value is 1, one may correct the 6-bit value by bitwise XORing with 010110 (here 010110=110000^100110). Note that it is not even necessary to make this detection and correction immediately: in absence of new X-values on the input, MISR will have 2 possible "correct" states during indefinitely long time, and one may freely choose a convenient moment for the correction (this is why the present invention is called "postponed"). Each new "X" typically multiplies the number of "correct" states by 2 (in some rare cases it is possible that the number of "correct" states will remain unchanged), and each act of correction divides this number by 2.

Suppose there are two X-values (for the simplicity, at the same moment). Let it be the same compression scheme 8 bits→6 bits as above, and let the test response be 01000XX0. That is, there are 4 possible actual test responses in absence of faults:
   01000000
   01000010
   01000100
   01000110

Compression converts these 4 vectors into, respectively,
   101000
   111110
   110001
   100111

There are 5 possibilities to choose one-bit signal for ambiguity detection: Y2, . . . , Y6. All may be used for this purpose. Suppose one chooses Y2. Then, applying ambiguity reduction by a rule, say, "if Y2=1, then to XOR the vector with 010110" (010110 was obtained as XOR of vector with Y2=1 and one with Y2=0, currently first two vectors are used), one may transform, respectively, the foregoing 4 vectors to
   101000
   101000
   100111
   100111

That is, now one may have 2 vectors instead of 4. But one cannot say that one has masked even a single actual X-value, because 101000 and 100111 (in terms of original 8-bit test responses) correspond to vectors with at least two differences.

The correctable MISR module 304 may be a modification of a standard signature register of a size M (which is a linear FSM with M flip-flops, where input of each flip-flop is XOR of some data inputs and some outputs of other flip-flops). The modification is as follows. Let the correction inputs 310 include two groups: L address bits (a[0], . . . , a[L−1]), and M correction bits (c[0], . . . , c[M−1]). Then input signals of M flip-flops (s[0], . . . , s[M−1]) are corrected in such way: if address bits denote a number A, and Ath bit s[A] equals 1, then (s[0], . . . , s[M−1]) are bit-wise XORed with (c[0], . . . , c[M−1]). However, if c[0]= . . . =c[M−1]=0, then no correction is implemented.

The system 300 works as follows. Suppose correction bits (c[0], . . . , c[M−1]) may be non-0 (i.e., not zero) only at clock cycles T, 2T, 3T, . . . (suppose clock cycles for a particular test vector are numbered 1, 2, 3, . . . ). Let all X-values for a particular test vector be enumerated as X1, X2, . . . , Xk, where k is the total number of X-values. Let Xi arrive at the compressor 302 and the correctable MISR 304 at clock cycle Ti, where T1 <=T2<= . . . <=Tk. Then, the correction inputs (Ar, Cr) 310 for moment rT may be specified as follows, where Ar is address vector and Cr is correction vector.

Let Legal(t) be a set of all legal (i.e., corresponding to the case of no faults) states of the correctable MISR 304 after t clock cycles. Initially, Legal(0) has exactly 1 element (i.e., |Legal(0)|=1).

If at moment t, there are no X-values, and t is not one of T, 2T, 3T, . . . , then Legal(t) has no more elements than Legal(t−1). Preferably, Legal(t) and Legal(t−1) have exactly the same number of elements. Note that all elements of Legal(t) are results of the same linear (using XORs) transformation of respective elements of Legal(t−1). Thus, if Legal(t−1) has the structure of m-dimensional linear manifold (i.e., Legal(t−1)=a set of all possible vectors in the form (v0+a1 v1+ . . . +am vm), where v0, . . . , vm are some constant vectors, a1, . . . , am are variables with values 0 or 1, and "+" represents bitwise XOR), then Legal(t) has the same structure and the same dimension as Legal(t−1), but with another v0, . . . , vm.

If at moment t, there are exactly R X-values, and t is not one of T, 2T, 3T, . . . , then Legal(t) has up to $2^R$ times more vectors than Legal(t−1) (i.e., dimension of the linear manifold grows from m for Legal(t−1) to (m+R) for Legal(t)).

If t equals T, 2T, 3T . . . , values of the correction inputs 310 may be selected in such a way that the values may reduce the dimension of the linear manifold by 1 (when the dimension is greater than 0). Consider MISR's input signals at moment t if no correction is used. The input signals form a set of all linear combinations w(a1, . . . , am)=w0+a1 w1+ . . . +am wm, with known vectors (w0, . . . , wm) and variables (a1, . . . , am) from {0,1}. If m>0, then there is at least one bit position where not all w(a1, . . . , am) have the same values. Let it be Ath bit. Note that exactly ½ of all vectors w(a1, . . . , am) have Ath bit set to 0, and another ½ have Ath bit set to 1. Let w' and w'' be any vectors from the 1st and the 2nd halves, respectively. Then, correction address (a[0], . . . , a[L−1]) may be defined as a binary representation of index A, and correction bits (c[0], . . . , c[M−1]) may be defined as bits of (w' XOR w''). In this case, after correction the elements of the 2nd half are changed, and the change may make them corresponding to the 1st half. This makes the manifold dimension reduced by 1 or the set size reduced twice. For example, in the foregoing-described example in paragraph [0019], there are 4 vectors: 101000 111110 110001 100111. The 1st half (Y2=0) is 101000 and 100111, and the 2nd half (Y2=1) is 111110 and 110001. As one may see, XORing with 010110 converts the 2nd half exactly into the 1 st half.

Figure 4:
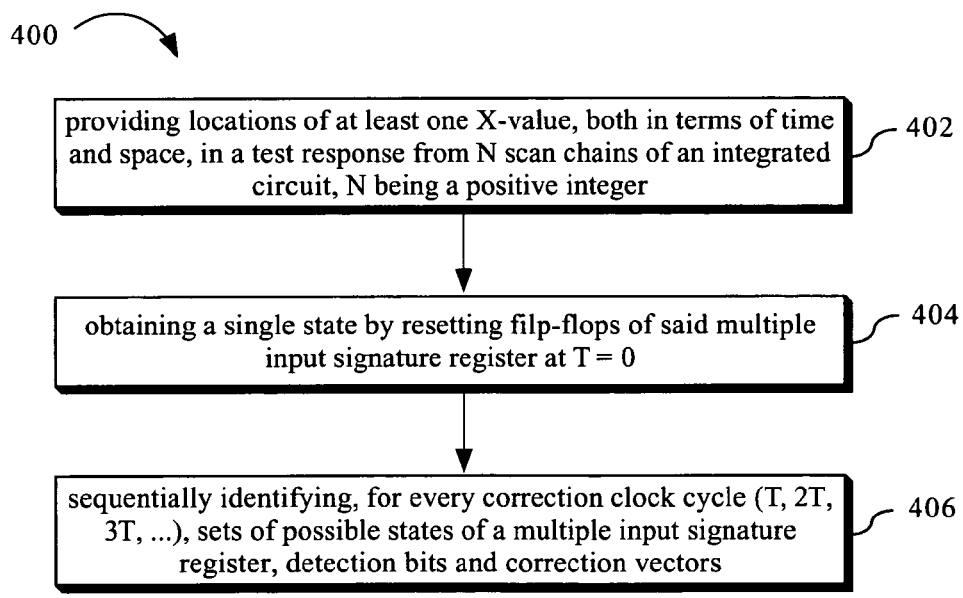
FIGS. 4 and 5 are flow diagrams of a method for implementing postponed quasi-masking test output compression in an integrated circuit in accordance with an exemplary embodiment of the present invention.
Figure 5:
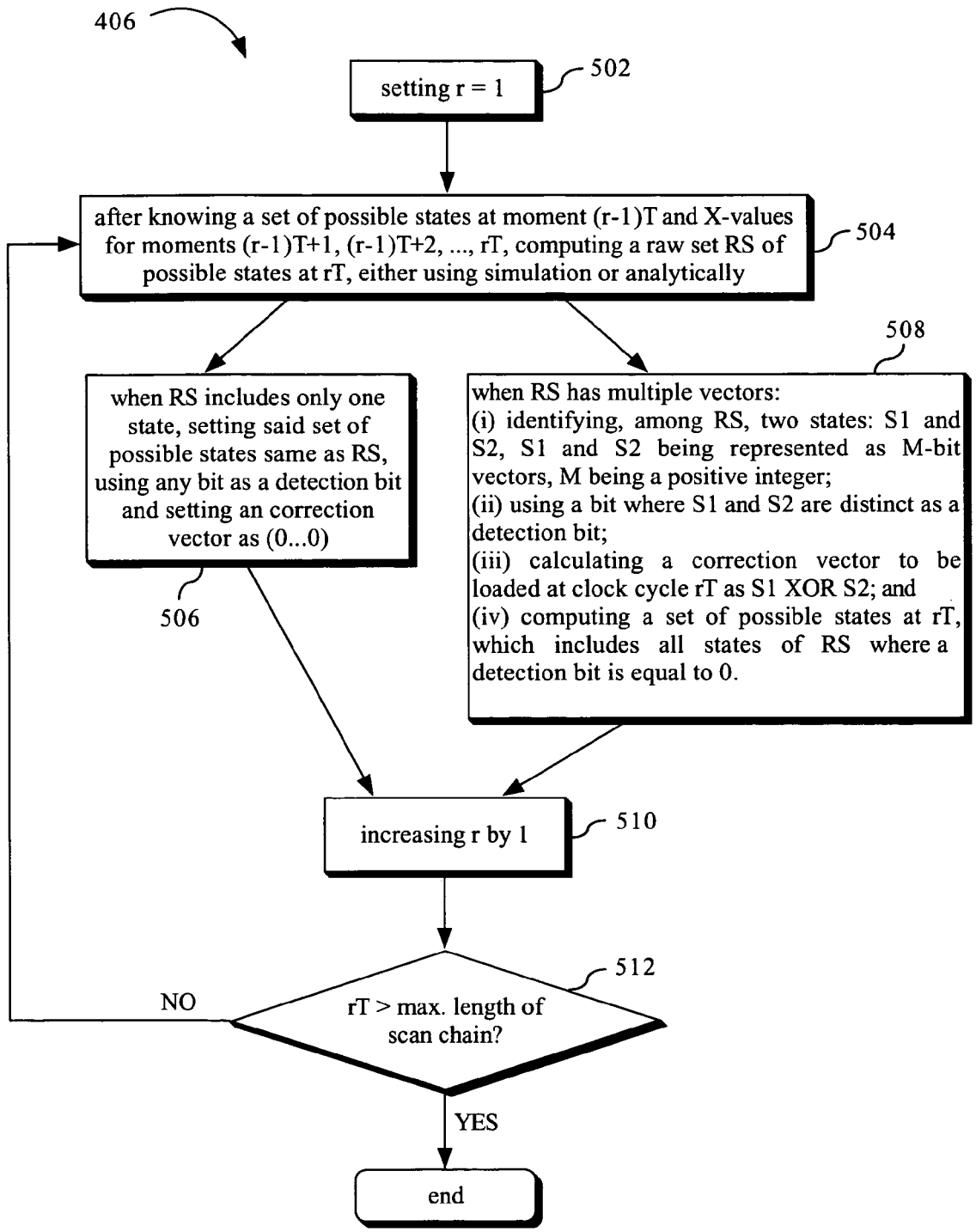

FIG. 4 is a flow diagram of a method 400 for implementing postponed quasi-masking test output compression in an integrated circuit in accordance with an exemplary embodiment of the present invention. The method 400 may be implemented in the system 300 shown in FIG. 3. The method 400 may include steps as follows. Locations of at least one X-value, both in terms of time (i.e., clock cycles at which the X-value will reach a multiple input signature register) and space (i.e., positions in the N inputs to a compactor), are provided in a test response from N scan chains of an integrated circuit, N being a positive integer 402. A single state is obtained by resetting (i.e., initializing) filp-flops of the multiple input signature register at T=0 (i.e., at the very beginning) 404. For every correction clock cycle (T, 2T, 3T, . . . ), sets of possible states of a multiple input signature register, detection bits and correction vectors are sequentially identified 406. FIG. 5 is a flow diagram of the step 406 shown in FIG. 4 in accordance with an exemplary embodiment of the present invention. The step 406 may start with step 502, in which r is set to 1. After knowing a set of possible states at moment (r−1)T and X-values for moments (r−1)T+1, (r−1)T+2, . . . , rT, a "raw" set RS of possible states at rT may be computed, either using simulation or analytically 504. In step 506, when RS contains only one state, then the set of possible states may be the same as RS, any bit may be used as a detection bit, and a correction vector is set as (0 . . . 0) 506. In step 508, when RS includes multiple vectors, the following sub-steps are implemented: (i) identifying (randomly or in any other way), among RS, two distinct states: S1 and S2, S1 and S2 being represented as M-bit vectors, M being a positive integer; (ii) using a bit where S1 and S2 are distinct as a detection bit (if there are multiple possibilities, any one of them may be chosen, either randomly or in any other way); (iii) calculating a correction vector to be loaded at clock cycle rT as S1 XOR S2; and (iv) computing a set of possible states at rT, which includes all states of RS where a detection bit is equal to 0. Following either the step 506 or 508, r is increased by 1 in step 510. In step 512, it is checked whether rT is greater than the maximum length of the scan chain. If the answer is no, the step 406 returns to the step 504; if the answer is no, the step 406 is terminated.

It is understood that the specific order or hierarchy of steps in the processes disclosed is an example of exemplary approaches. Based upon design preferences, it is understood that the specific order or hierarchy of steps in the processes may be rearranged while remaining within the scope of the present invention. The accompanying method claims present elements of the various steps in a sample order, and are not meant to be limited to the specific order or hierarchy presented.

It is believed that the present invention and many of its attendant advantages will be understood by the foregoing description. It is also believed that it will be apparent that various changes may be made in the form, construction and arrangement of the components thereof without departing from the scope and spirit of the invention or without sacrificing all of its material advantages. The form herein before described being merely an explanatory embodiment thereof, it is the intention of the following claims to encompass and include such changes.

What is claimed is:

1. A system for implementing postponed quasi-masking test output compression in an integrated circuit, comprising:
   a compressor for compressing a test response from N scan chains of an integrated circuit into M outputs, said test response indicating faults in said integrated circuit, M and N being positive integers; and
   a correctable multiple input signature register with a size of M, communicatively coupled to said compressor, for receiving said M outputs from said compressor as data inputs ($s[0], \ldots, s[M-1]$) and receiving M correction bits ($c[0], \ldots, c[M-1]$) and L address bits ($a[0], \ldots, a[L-1]$) as correction inputs, L being a positive integer, $2^L >= M$,
   wherein said correctable multiple input signature register is suitable for detecting said faults when there is no or at least one unknown value in said test response.

2. The system of claim 1, wherein said compressor is a combinational circuit that computes a linear mapping.

3. The system of claim 1, wherein if said compressor produces a same output value when receiving two different input vectors $x=(x1, \ldots, xN)$ and $y=(y1, \ldots, yN)$, a number of positions where xi differs from yi is as large as possible.

4. The system of claim 3, wherein output values of said compressor are different when said input vectors x and y differ in a single bit.

5. The system of claim 1, wherein said correctable multiple input signature register is a finite state machine.

6. The system of claim 1, wherein when $c[0]= \ldots =c[M-1]=0$, said data inputs ($s[0], \ldots, s[M-1]$) are not corrected.

7. The system of claim 1, wherein when said L address bits ($a[0], \ldots, a[L-1]$) denote a number A, and Ath bit $s[A]=1$, said data inputs ($s[0], \ldots, s[M-1]$) are bit-wise XORed with said M correction bits ($c[0], \ldots, c[M-1]$).

8. The system of claim 1, wherein if said M correction bits ($c[0], \ldots, c[M-1]$) are non-0 only at clock cycles T, 2T, 3T, . . . , clock cycles for a particular test vector being numbered 1, 2, 3, . . . , if for a particular test vector all X-values are enumerated as X1, X2, ..., Xk, k being a total number of X-values, and if Xi arrives at said compressor and said correctable multiple input signature register at clock cycle Ti, $T1<=T2<= \ldots <=Tk$, Legal(t) are defined as a set of all legal states of said correctable multiple input signature register after t clock cycles, |Legal(0)|=1.

9. The system of claim 8, wherein if at moment t there are no X-values, and t is not one of T, 2T, 3T, . . . , then Legal(t) has no more elements than Legal(t−1).

10. The system of claim 9, wherein said Legal(t) and said Legal(t−1) have a same number of elements.

11. The system of claim 8, wherein if at moment t there are R X-values, and t is not one of T, 2T, 3T, . . . , then Legal(t) has up to $2^R$ times more vectors than Legal(t−1).

12. The system of claim 8, wherein if t equals one of T, 2T, 3T . . . , values of said correction inputs are selected so that a manifold dimension of Legal(t−1) is reduced by 1 when said manifold dimension is greater than 0.

13. A system for implementing postponed quasi-masking test output compression in an integrated circuit, comprising:
   a compressor for compressing a test response from N scan chains of an integrated circuit into M outputs, said test response indicating faults in said integrated circuit, M and N being positive integers;
   means for detecting said faults when there is no or at least one unknown value in said test response; and
   means for masking, communicatively coupled to said compressor, for receiving said M outputs from said compressor as data inputs ($s[0], \ldots, s[M-1]$).

14. The system of claim 13, wherein said compressor is a combinational circuit that computes a linear mapping.

15. The system of claim 13, wherein if said compressor produces a same output value when receiving two different input vectors $x=(x1, ..., xN)$ and $y=(y1, \ldots, yN)$, a number of positions where xi differs from yi is as large as possible.

16. The system of claim 15, wherein output values of said compressor are different when said input vectors x and y differ in a single bit.

17. The system of claim 13, wherein said means for detecting is suitable for receiving M correction bits ($c[0], \ldots, c[M-1]$) and L address bits ($a[0], \ldots, a[L-1]$) as correction inputs, L being a positive integer, $2^2 >= M$.

18. The system of claim 17, wherein when $c[0]= \ldots =c[M-1]=0$, said data inputs $(s[0], \ldots, s[M-1])$ are not corrected.

19. The system of claim 17, wherein when said L address bits $(a[0], \ldots, a[L-1])$ denote a number A, and Ath bit $s[A]=1$, said data inputs $(s[0], \ldots, s[M-1])$ are bit-wise XORed with said M correction bits $(c[0], \ldots, c[M-1])$.

20. A method for implementing postponed quasi-masking test output compression in an integrated circuit, comprising steps of:
  providing locations of at least one X-value, both in terms of time and space, in a test response from N scan chains of an integrated circuit, N being a positive integer;
  obtaining a single state by resetting filp-flops of said multiple input signature register at T=0; and
  sequentially identifying, for every correction clock cycle (T, 2T, 3T, . . . ), sets of possible states of a multiple input signature register, detection bits and correction vectors.

21. The method of claim 20, wherein said step of sequentially identifying comprising sub-steps of:
  (a) setting r=1;
  (b) after knowing a set of possible states at moment (r-1)T and X-values for moments (r-1)T+1, (r-1)T+2, . . . , rT, computing a raw set RS of possible states at rT, either using simulation or analytically;
  (c) when RS includes only one state, setting said set of possible states same as RS, using any bit as a detection bit and setting an correction vector as (0 . . . 0)
  (d) when RS includes multiple vectors, implementing steps as follows:
    (di) identifying, among RS, two states: S1 and S2, S1 and S2 being represented as M-bit vectors, M being a positive integer;
    (dii) using a bit where S1 and S2 are distinct as a detection bit;
    (diii) calculating a correction vector to be loaded at clock cycle rT as S1 XOR S2; and
    (div) computing a set of possible states at rT, which includes all states of RS where a detection bit is equal to 0;
  (e) increasing r by 1;
  (f) returning to said sub-step (b) when said rT is not greater than a maximum length of a scan chain; and
  (g) terminating said step of sequentially identifying when said rT is greater than said maximum length of said scan chain.

* * * * *